United States Patent [19]
Vu et al.

[11] Patent Number: 6,087,728
[45] Date of Patent: *Jul. 11, 2000

[54] INTERCONNECT DESIGN WITH CONTROLLED INDUCTANCE

[75] Inventors: Quat T. Vu, Santa Clara; Ling-Chu Chien, Saratoga, both of Calif.

[73] Assignee: Intel Corporation, Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/671,447

[22] Filed: Jun. 27, 1996

[51] Int. Cl.⁷ .......................... H01L 23/48; H01L 23/52; H01L 29/40
[52] U.S. Cl. .......................... 257/758; 257/532; 257/691; 257/203
[58] Field of Search .................... 257/758, 776, 257/296, 202, 203, 204, 205, 206, 531, 535, 691, 692, 532

[56] References Cited

U.S. PATENT DOCUMENTS

| | | | |
|---|---|---|---|
| 5,025,304 | 6/1991 | Reisman et al. | 257/758 |
| 5,287,002 | 2/1994 | Freeman, Jr. et al. | 257/758 |
| 5,402,318 | 3/1995 | Otsuka et al. | 361/794 |
| 5,439,848 | 8/1995 | Hsu et al. | 437/195 |
| 5,471,091 | 11/1995 | Pasch et al. | 257/758 |
| 5,544,103 | 8/1996 | Lambertson | 365/185.15 |
| 5,585,664 | 12/1996 | Ito | 257/654 |
| 5,631,478 | 5/1997 | Okumura | 257/758 |
| 5,719,439 | 2/1998 | Iwasaki et al. | 257/690 |
| 5,723,908 | 5/1998 | Fuchida et al. | 257/758 |

*Primary Examiner*—Mahshid Saadat
*Assistant Examiner*—Allan R. Wilson
*Attorney, Agent, or Firm*—Cindy T. Faatz

[57] ABSTRACT

An integrated circuit device interconnect with controlled inductance. An integrated circuit device includes an insulating layer formed on a substrate and a an interconnect disposed on the insulating layer extending along a first path. A dedicated current return path having one end configured to be coupled to ground is disposed on the first insulating layer parallel to the interconnect, such that the signal received by the interconnect is returned to ground via the dedicated current return path when the dedicated current return path is coupled to ground. Inductance of the interconnect is thus controlled by reducing the area of the circuit loop formed by the interconnect and the parallel dedicated current return path. In one embodiment, the dedicated current return path is formed in an embedded ground plane just above or below the first interconnect. In this embodiment, the interconnect and the dedicated current return path together act as a built-in decoupling capacitor, further offsetting the inductive time constant to approach critical damping.

14 Claims, 4 Drawing Sheets

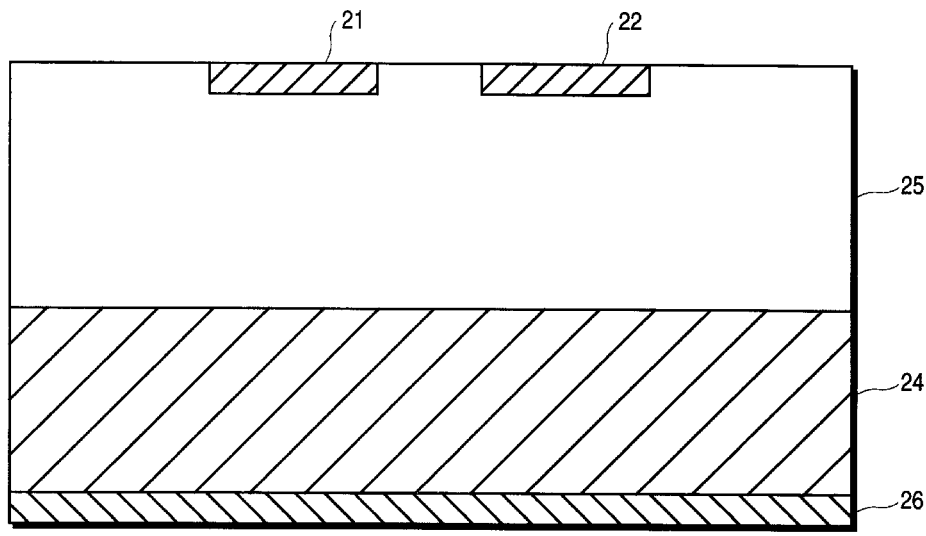
FIG. 2A
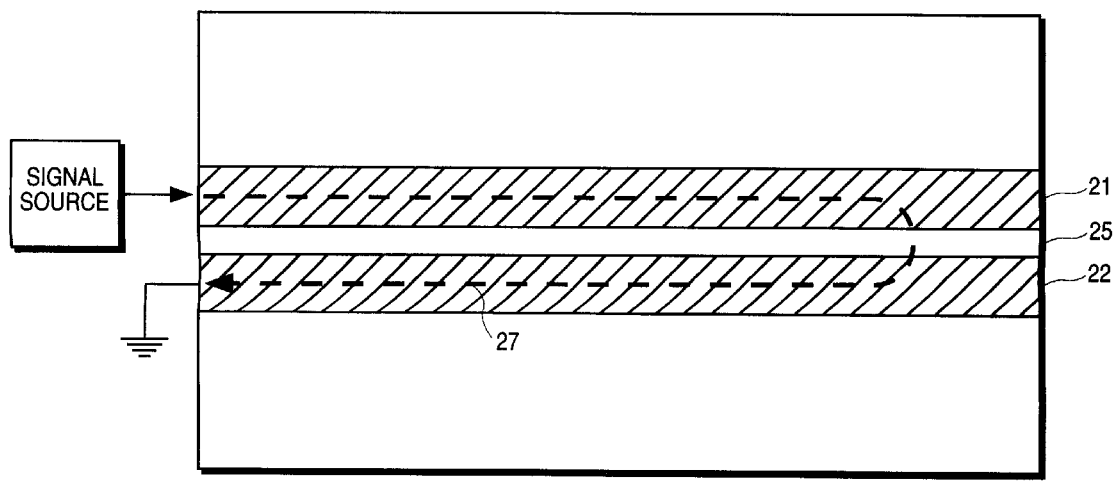
FIG. 2B (TOP VIEW)

INTERCONNECT DESIGN WITH CONTROLLED INDUCTANCE

BACKGROUND OF THE INVENTION

1. Field of the Invention

The present invention relates to the field of semiconductor integrated circuit devices, and in particular, to the design of interconnections for those devices.

2. Description of Related Art

Interconnect design for modern integrated circuit devices, especially for microprocessors, involves many considerations to minimize noise, ensure proper signal timing and switching, and to optimize performance. Key among the factors which must be considered is the effect of parasitics on the quality of signals transmitted by the interconnect.

Capacitance and inductance have varying parasitic effects on signals depending on the frequency at which current and voltage are changing over the interconnect, as well as the effective width of the interconnect. Most microprocessor interconnects, for example, are very narrow and thus, have a relatively high resistance. At typical microprocessor operating frequencies, for higher resistance interconnects, the parasitic effect of inductance on the interconnect impedance has been relatively small in comparison to the resistive component of the interconnect impedance and thus, has not been a concern. Even for wider signal lines having lower resistances, the operating frequencies of microprocessors have typically been in a range in which resistance dominates the interconnect impedance characteristics such that inductive parasitics can be ignored.

However, as the clock rate of digital integrated circuit devices, such as microprocessors, continues to climb, the inductive reactance, especially for relatively low-loss interconnects, becomes a major component of the interconnect impedance leading to problems of noise, ringing and delays. This is because the inductive reactance of a circuit varies in direct proportion to signal frequency. With clock rates targeted to reach into the gigahertz range, the significant upper frequency components of the digital signal may be as high as 15 GHz. In this range, for low-loss interconnects, even taking into account the increased resistance and reduced inductance caused by the skin effect at high frequencies, the resistance may not be high enough to offset the increased inductive reactance.

Low-loss interconnects are interconnects such as power buses, clock trunks and signal buses, which have a relatively high effective width. For example, power buses are wide and thus, have a low resistance. At high frequencies, the noise in low-resistance interconnects arises because the inductive time constant (L/R) dominates the capacitive time constant (RC) of the circuit. The circuit in this case is the circuit defined by the low-resistance interconnect and one of a multitude of possible paths through the integrated circuit chip by which current through the interconnect returns to ground.

To alleviate this noise and preserve signal integrity, it is important to come as close as possible to critical damping. Critical damping is achieved when the inductive and capacitive time constants of the circuit, L/R and RC, are equal to each other such that the capacitive and inductive effects on a signal effectively cancel each other out. One approach to balancing the time constants in the above situation is to add a decoupling capacitor. Adding a decoupling capacitor can increase the RC time constant of the circuit to balance out the larger inductive time constant. However, it may be undesirable to add a decoupling capacitor due to space and/or cost constraints. Additionally, adding a decoupling capacitor may require several additional processing steps if an on-chip decoupling capacitor is required.

Another solution to approach critical damping is to reduce the inductive time constant by reducing the inductance of the circuit. The inductance of a circuit is determined by several factors, key among them being the area of the signal "loop" formed by the circuit being evaluated. In currently available integrated circuit devices, the interconnect inductance is difficult to control to the extent necessary because of difficulties in determining the area of the current loop including the interconnect.

This issue is further clarified in reference to FIG. 1. FIG. 1 illustrates a simplified example of a cross-section of an integrated circuit device. A low-resistance interconnect 11 is formed in a layer on a substrate 12 and is separated from the substrate 12 by an insulating layer 13, referred to as an interlevel dielectric (ILD), and possibly by other layers (not shown). The load 14 represents a unit or device on the integrated circuit device which receives a signal from the interconnect 11. As is well-known in the art, all current signals supplied to devices on the integrated circuit device, including those transmitted by the low-resistance interconnect of FIG. 1, must eventually return to ground.

In the example shown in FIG. 1, there are many possible paths over which the current may return to ground. For example, a signal transmitted by the interconnect 11 may return to ground through the substrate 12 as shown by the current path 15, and/or through a ground plane 16 on the backside of the substrate 12, and/or through any one or more of a number of other possible current paths in the integrated circuit device. Thus, the current return path may either be close to the interconnect 11, or far away, and multiple current return paths may be involved making the inductance of the circuit difficult to determine. Because the current return path is not well defined, the inductance and thus, the inductive reactance is difficult to control effectively.

Thus, it is desirable to be able to control the inductance of low-loss interconnect lines to approach critical damping such that signal integrity is preserved even at very high frequencies.

SUMMARY OF THE INVENTION

The invention provides a method and apparatus for controlling the inductance of an integrated circuit device interconnect to improve signal quality at very high frequencies. The integrated circuit device includes a first insulating layer disposed on a substrate and an interconnect disposed on the insulating layer extending along a first path. The integrated circuit device of the invention also includes a dedicated current return configured to be coupled to ground. The dedicated current return path is disposed on the first insulating layer parallel to the interconnect such that the signal received by the interconnect is returned to ground over the dedicated current return path when the current return path is coupled to ground. The inductance of the interconnect is thus controlled by controlling the area of the circuit loop formed by the interconnect and the parallel dedicated current return path.

In one embodiment, the dedicated current return path is formed in an embedded ground plane just above or below the first interconnect. In this embodiment, the interconnect and the dedicated current return path together act as a built-in decoupling capacitor, further offsetting the inductive effects to approach critical damping.

BRIEF DESCRIPTION OF THE DRAWINGS

The invention will be understood more fully from the detailed description given below and from the accompanying drawings of embodiments of the invention, which, however, should not be taken to limit the invention to the specific embodiments, but are for explanation and understanding only.

FIG. 2A illustrates a cross-sectional view of an interconnect and a dedicated current return path parallel to the interconnect on a same metal layer of an integrated circuit device in accordance with one embodiment of the invention.

FIG. 2B illustrates a top view of the interconnect and dedicated current return path of FIG. 2A.

DETAILED DESCRIPTION OF EMBODIMENTS OF THE INVENTION

Figure 1:
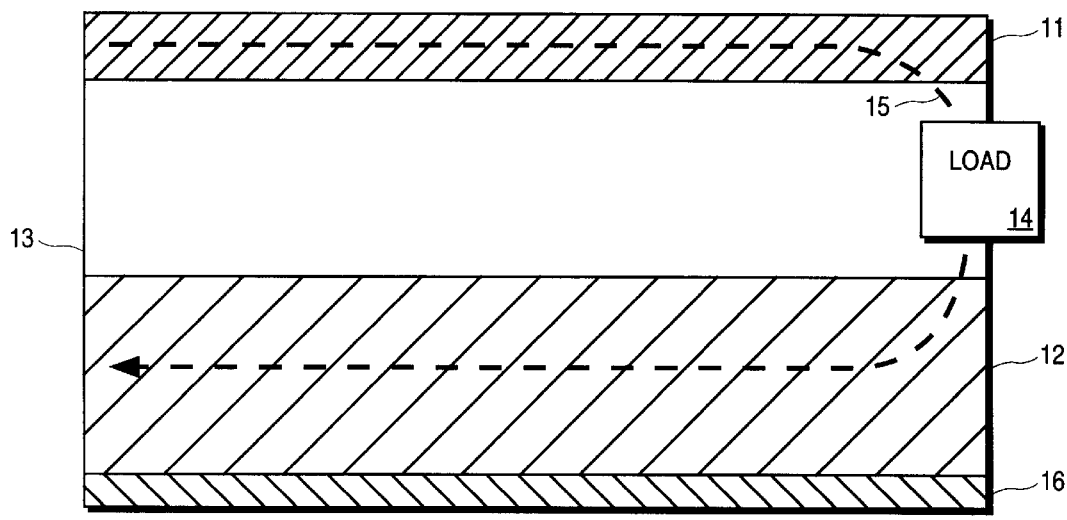
FIG. 1 illustrates a cross-sectional view of a prior art interconnect structure having multiple possible current return paths.

An apparatus and method for controlling inductance in an integrated circuit device interconnect is disclosed. In the following description, specific details such as line widths, device layers and materials are set forth in order to provide a thorough understanding of the invention. However, it will be appreciated by one of ordinary skill in the art that the invention may be practiced without these specific details. In other instances, well-known device structures, processing steps and electrical properties have not been described in detail in order to avoid obscuring the invention. Further, although the present invention is described below as being fabricated, for example, in a VLSI integrated circuit chip, one skilled in the art would understand that the invention could be embodied within multi-chip modules, integrated circuit boards which do not include ground planes, or other structures having similar characteristics and issues at high frequencies.

Dedicated Current Return Path of One Embodiment of the Invention

FIG. 2A illustrates a cross-section of a device, such as an integrated circuit device, including an interconnect 21 in accordance with one embodiment of the invention. The cross-section of FIG. 2A is taken across the width of the interconnect 21 such that the view is down its longitudinal axis. The interconnect 21 of FIG. 2A is a low-resistance interconnect such as a power bus, clock trunk or signal bus in one embodiment, and is used to transmit signals and to couple active devices (not shown) to create functional circuits.

It should be noted that a signal bus is referred to herein as a low-resistance interconnect even though it actually includes several individual signal lines. The individual signal lines of a signal bus are each narrow, but are placed in very close proximity to each other. The effective width of the signal bus, because the spacing between the lines is small, is nominally the same as the combined width of the individual signal lines for the purposes of evaluating the impact of parasitic effects on signal quality because of the low effective resistance and capacitance when all of the individual lines switch together in synchronization. For this reason, signal buses are included as an example of an effectively low-resistance interconnect.

Further, it is to be understood that, although the invention is described herein with reference to low-resistance interconnects, the present invention may also be used in accordance with higher resistance interconnections on integrated circuit devices, multi-chip modules or the like, to better control parasitics and improve signal quality.

The interconnect 21 of FIG. 2A is about 120 $\mu$m wide with a thickness of about 1.7 $\mu$m in one embodiment, and is configured on a specific metal pattern layer of a device such as a microprocessor, which may include multiple metal pattern layers. The interconnect 21 may be formed using any interconnection formation process. In one embodiment, the low-resistance interconnect 21 is formed of aluminum. Other materials such as aluminum alloys, tungsten, copper, or one or more other similar materials may also be used. The choice of materials may be dependent on considerations such as processing temperatures or the conditions to which the integrated circuit device will be subjected during use.

As shown, the interconnect 21 is disposed on a substrate 24, such as a semiconductor wafer having, for example, device regions such as diffused junctions, other structures such as gates, local interconnections, metal layers, or other device structures or layers. Other types of substrates are also within the scope of the invention. The interconnect 21 is separated from the substrate 24 of FIG. 2A by one or more insulating interlevel dielectric (ILD) layers 25 in one embodiment, and in some cases, by other intermediate layers which may include devices such as capacitors, transistors and the like. The dielectric layer 25 may be formed of one or more layers of silicon nitride, silicon dioxide, silicon oxynitride, or low dielectric constant polymers, for example. The thickness and material of the ILD layer 25 is not critical as long as the ILD layer 25 provides electrical isolation between the interconnect 21 and any conductive layers in the substrate 24.

Also, in one embodiment, the backside of the substrate 24 is coupled to a ground plane 26 which extends over the entire backside surface of the integrated circuit device from which the cross-section of FIG. 2A is taken. The ground plane 26 is configured to be coupled to ground when the integrated circuit device including the cross-section of FIG. 2A is used in a system, as is well-known in the art. In another embodiment, the backside of the integrated circuit device is not metallized. In this embodiment, a ground plane may be provided within the integrated circuit package itself which may be a controlled collapse chip connect (C4) package or "flip chip," for example.

As discussed in the Background section, in operation, each signal communicated by the interconnect 21 to a unit on the integrated circuit device must return to ground. In existing devices, a current return path is not specifically provided. The signal must find its way to ground through one of a multitude of possible paths through the integrated circuit device as discussed above in reference to FIG. 1, none of which may provide the characteristics needed to maintain signal integrity. Since the inductance of the current path including the interconnect is determined largely by the area of the current loop, it is difficult for a designer to reliably maintain signal quality, especially at very high frequencies where inductance can become a significant factor.

To enable a designer to control the inductance of an interconnect such as the interconnect 21, the present invention provides a dedicated current return path 22 over which signals transmitted by the interconnect 21 are returned to ground. The dedicated current return path 22 is formed on the substrate 24 parallel to the low-resistance interconnect 21 and having approximately a same length as the low-resistance interconnect 21. In the embodiment illustrated in FIG. 2A, the dedicated current return path 22 is formed in the same metal layer as the interconnect 21 using the same processing steps and materials. One end of the dedicated current return path 22 is configured to be coupled to ground. Similarly, one end of the interconnect 21 is configured to receive a signal from a signal source. For example, if the interconnect 21 is a power bus, the interconnect will be configured to receive a Vcc signal. The dedicated current return path 22 may be coupled to ground directly or through a via electrically coupling the dedicated current return path 22 to a ground plane or other ground source.

FIG. 2B illustrates a top view of the low-resistance interconnect 21 and the dedicated current return path 22 of FIG. 2A. It is understood that, in practice, other layers such as additional insulating layers, metal layers, and passivation layers may be formed on top of the interconnect 21. The overhead view of FIG. 2B illustrates an integrated circuit device segment as it might appear without these additional layers. It is also understood that in operation, the interconnect 21 is coupled to devices on the integrated circuit which act as loads (not shown). Only a small portion of the interconnect 21 is shown for purposes of illustration.

The line 27 illustrates the path through the interconnect 21 and the dedicated current return 22 which a signal received by the interconnect 21 from a signal source follows if the dedicated current return 22 is coupled to ground. Part of the current flows through the interconnect 21, through a load or loads connected to the interconnect (not shown) and then through the dedicated current return path 22 to ground. Another part of the current flows through the interconnect 21, across the insulating dielectric layer 25 and then through the dedicated current return path 22 to ground.

By providing a dedicated current return path 22 for the interconnect 21, the present invention ensures a controlled, predetermined path to ground for signals transmitted over the interconnect. Further, as shown in FIG. 2B, by forming the dedicated current return path 22 parallel, and in relatively close proximity to the interconnect 21, the size of the loop 27 formed by the interconnect 21 and the dedicated current return path 22 is kept small. Within the limits of minimum spacing considerations for a particular processing technology, the design of the interconnect and the dedicated current return path can be adjusted to meet the desired inductance requirements for particular operating conditions of a particular device. In this manner, the inductive reactance of the circuit including the interconnect 21 can be controlled to approach critical damping. Thus, in accordance with the present invention, low-resistance interconnects can be designed which produce few if any inductive effects on the signals transmitted over the interconnect, even at very high operating frequencies.

It should be noted that in most cases, a dedicated current return such as the dedicated current return path 22 of FIGS. 2A and 2B need only be provided for effectively wide, and thus, low-resistance, interconnects, such as the power buses, clock trunks and signal buses mentioned above, on an integrated circuit device. Thus, although additional space in the metal layer is required for the dedicated current return path 22, the number of dedicated current return paths needed is typically small.

Dedicated Current Return on a Different Metal Layer

Figure 3A:
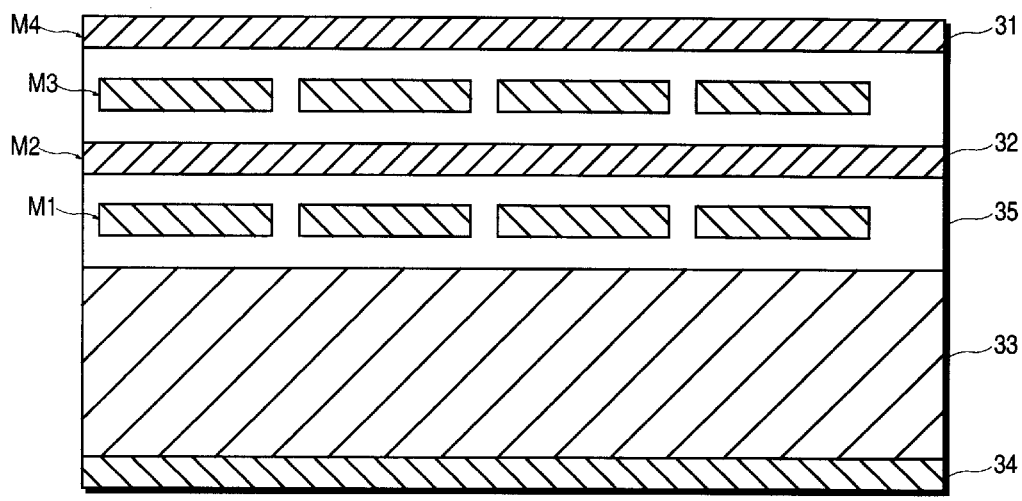
FIG. 3A illustrates a cross-sectional view of an interconnect down a first axis of the interconnect, and a dedicated current return path parallel to the interconnect on a different metal layer in accordance with another embodiment of the invention.
Figure 3B:
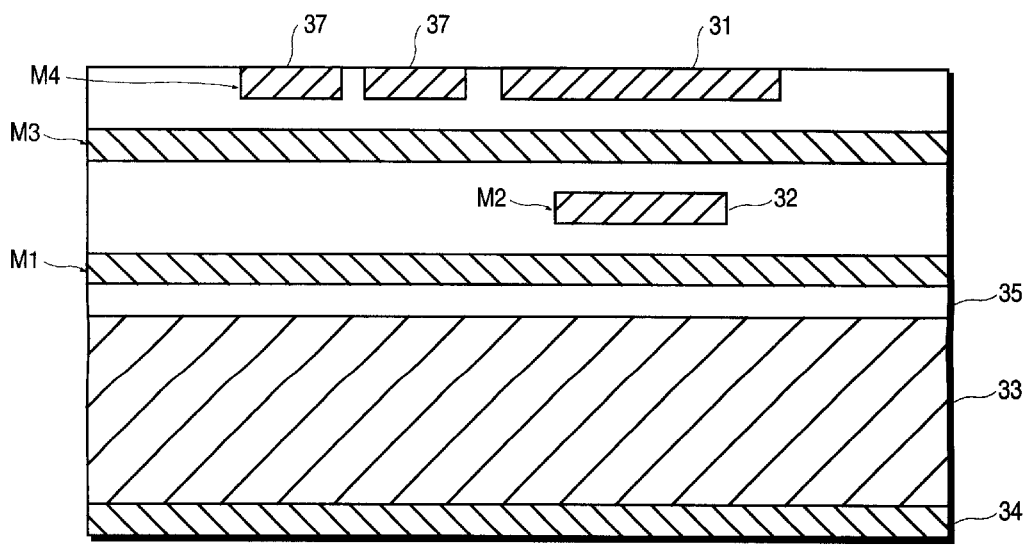
FIG. 3B illustrates another cross-sectional view of the interconnect and current return path of FIG. 3A down an axis of the interconnect perpendicular to the first axis.

Referring now to FIG. 3A, a cross-section of a device including an interconnect 31 and dedicated current return path 32 in accordance with another embodiment of the invention are illustrated. The interconnect 31 of FIGS. 3A and 3B is a low-loss interconnect as discussed above in reference to FIGS. 2A and 2B. The interconnect 31 is formed on a substrate 33, such as a silicon wafer, and is separated from the substrate by one or more insulating layers 35. The cross-section of FIG. 3A is taken down a first axis of the interconnect 31 along its length.

The device illustrated in FIGS. 3A and 3B includes four metal layers referred to as metal one (M1), metal two (M2), metal three (M3), and metal four (M4), with the higher numbered metal layers being formed further from the substrate. A different number of metal layers may be included in different embodiments. As illustrated in FIG. 3A, each of the four metal layers of the integrated circuit device of this example is laid out orthogonally to the metal layer(s) above and/or below it, such that alternate metal layers include parallel metal lines. In this manner, each layer is optimized for routability.

In the embodiment illustrated in FIGS. 3A and 3B, the low-resistance interconnect 31 of the invention is formed in the M4 layer. As discussed above, the inductance of a circuit is largely dependent on the size of the loop formed by the circuit. Thus, although a dedicated current return for the interconnect 31 could be formed in the M3 layer, the interconnect lines of the M3 layer in this embodiment, are laid out perpendicular to the low-resistance interconnect 31 of interest on the M4 layer as shown in FIG. 3A. The loop formed by the low-resistance interconnect 31 and a dedicated current return path formed in the M3 layer would be large, and thus, have a high inductance.

The dedicated current return path 32 of this embodiment is therefore formed in the M2 layer which has interconnect lines parallel to the interconnect lines of the M4 layer. As in the embodiment described above, the interconnect 31 and the dedicated current return path 32 are approximately the same length. One end of the dedicated current return path 32 is configured to be coupled to ground either through a via extending to another conductive layer coupled to ground or by being directly coupled to a ground source. Similarly, one end of the interconnect 31 is coupled to receive a signal either directly from a signal source or by a via coupled to a signal source. In this manner, the low-resistance interconnect 31, and the dedicated current return path 32 form a low-resistance, continuous path by which signals are transmitted over the interconnect 31, and a known, controlled path through which the current is returned to ground.

FIG. 3B shows the interconnect 31 and the corresponding dedicated current return path 32 from a different view, with the cross-section of FIG. 3B taken across the width of the interconnect 31. As illustrated, the M4 layer may include other metal lines, such as the interconnections 37, in addition to the low-resistance interconnect 31. Also, referring to FIG. 3B, the low-resistance interconnect 31 and its dedicated current return path 32 are not only parallel in direction, they are also configured such that they are aligned within the integrated circuit device to minimize the size of the circuit loop formed and thus, minimize and control the inductance of the circuit.

In one embodiment, the spacing between the interconnection and its dedicated current return of FIGS. 3A and 3B is about 3 $\mu$m. The interconnect of the invention is relatively wide, about 120 $\mu$m in one embodiment, such that the interconnect capacitance to all nearest metal lines is maintained at a relatively large value. When designing the interconnect 31 to approach critical damping, the capacitance of the interconnect 31 contributed by the interconnect area and proximity to other metal lines offsets the inductive reactance of the circuit such that the inductance of the circuit including the interconnect 31 can be relatively large and its area does not need to be controlled as tightly. Further, the dedicated current return path 32 of one embodiment can be narrower than the corresponding interconnect 31, thereby increasing its resistance and further offsetting the inductive effects of the circuit.

To provide an example, if the spacing between the interconnect 31 on the M4 layer and the dedicated current return path 32 on the M2 layer is about 3 $\mu$m, and the orthogonal M3 layer is about 1 $\mu$m away, the inductance of the circuit formed by the interconnect 31 and the dedicated current return path 32 is about 0.38 nH/cm and the capacitance is about 44 pF/cm for an oxide dielectric. The resistance value leading to a critical damping situation is R=SQRT(0.38 nH/0.044 nF)=2.94 ohms/cm. If the interconnect and dedicated signal return are formed of aluminum having a resistivity of about 3 $\mu$ohm/cm and assuming the interconnect 31 and the dedicated signal return path 32 are each 1 cm in length, the resistance is about 4 ohms. The circuit is thus RC dominated and close to critical damping with little or no decoupling capacitance required.

Dedicated Current Return in an Embedded Ground Plane

Figure 4A:
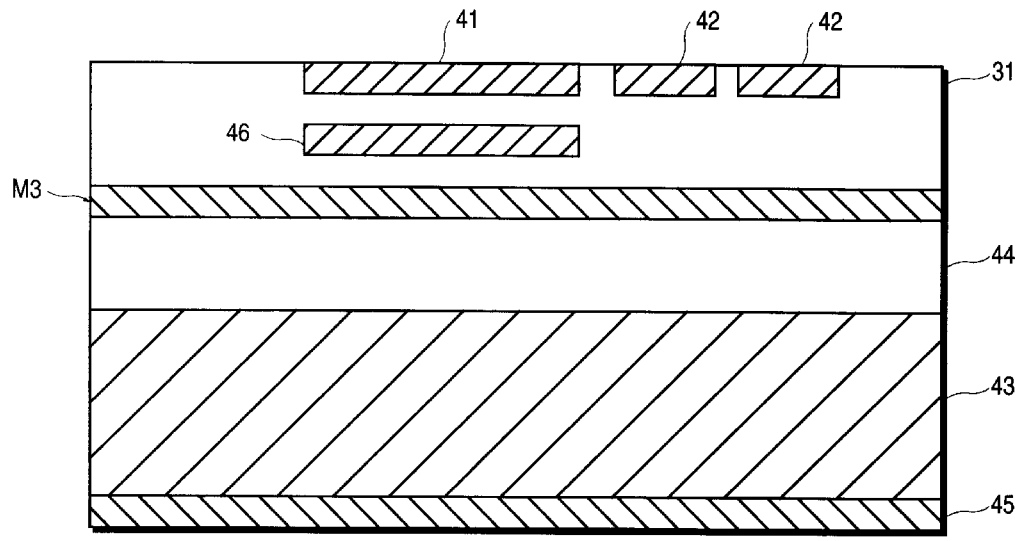
FIG. 4A illustrates a cross-sectional view down a first axis of an interconnect having a dedicated current return path parallel to the interconnect on an embedded plane in accordance with another embodiment of the invention.
Figure 4B:
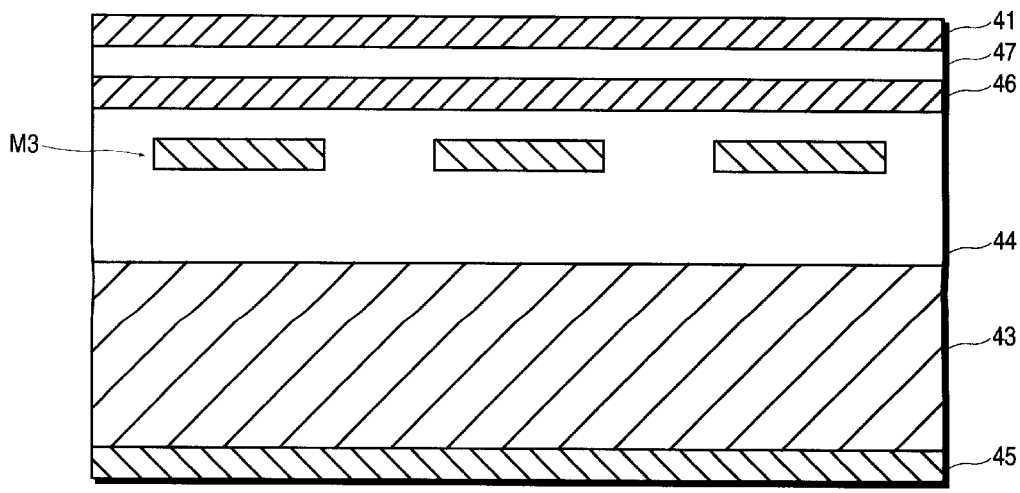
FIG. 4B illustrates a cross-sectional view of the interconnect and current return path of FIG. 4A down a second axis of the interconnect perpendicular to the first axis.

FIGS. 4A and 4B illustrate another embodiment of the interconnect and dedicated current return path of the present invention. Similar to the embodiments discussed above, this embodiment is described in the context of a cross-section of a portion of an integrated circuit device. The interconnect of interest is a low-resistance interconnect such as a power bus, a clock trunk or a signal bus having a high effective width and low effective resistance.

The integrated circuit device of FIG. 4A, similar to those described above in reference to FIGS. 3A and 3B, includes multiple metal layers. This example includes four metal layers, M1, M2, M3 and M4, however only the M3 and M4 metal layers are shown in FIGS. 4A and 4B. A different number of metal layers may be included in other embodiments. In this example, the low-resistance interconnect 41 is formed in the M4 layer along with other interconnections such as the interconnections 42 of FIG. 4A. The integrated circuit device of FIG. 4A also includes an M3 layer having interconnections laid out orthogonally to the interconnect 41 and other interconnections 42 of the M4 layer. The M3 and M4 layers are formed on and separated from a substrate 43, such as a semiconductor wafer, by an insulating layer 44, and one or more other layers (not shown) which may include active devices and other insulating layers, for example. The backside of the substrate 43 is covered by a ground plane 45 as discussed above in reference to FIG. 2A.

In this embodiment, one end of the low-resistance interconnect 41 is also configured to be coupled to a signal source and one end of the dedicated current return path 46 is configured to be coupled to ground as discussed above. Also, as in the embodiments discussed above, the interconnect 41 and the dedicated current return path 46 are formed such that they are parallel to each other and approximately of the same length.

In the embodiment illustrated in FIGS. 4A and 4B, however, the dedicated current return path 46 is formed as a plane embedded just below the interconnect 41. It will be appreciated by one of skill in the art that the dedicated current return path of the invention may also be formed just above the interconnect 41 and that the separation between the interconnect 41 and the dedicated current return path 46 may be selected by the designer to provide desired signal characteristics within limits dictated by the particular process being used.

The embedded plane forming the dedicated current return path 46 of the invention is actually formed between the M4 and M3 layers in this example, as shown in FIG. 4A. In this manner, the interconnect 41 and its dedicated current return path 46 can be placed very close together thereby minimizing the size of the circuit loop formed by the low-resistance interconnect 41 and the dedicated current return path 46. In this manner, the inductive reactance of the circuit can be greatly reduced as compared to low-resistance interconnects on existing integrated circuit devices which do not provide dedicated current return paths. This configuration also provides the designer with additional flexibility and control to come as close as possible to reaching critical damping because the metal thickness and the thickness of the layer between the interconnect 41 and the dedicated current return path 46 can be controlled. Further, by forming the dedicated current return path 46 for the interconnect 41 in this manner, the interconnect 41 and the dedicated current return path 46 act as a built-in decoupling capacitor further offsetting the inductive time constant to approach critical damping. Finally, this configuration offers the advantage that additional space does not need to be taken up in one of the interconnection layers to provide the dedicated current return path of the invention as it can be embedded where desired, including between metal layers.

The embedded plane dedicated current return path 46 of the invention may be formed using any number of processes or could be part of any other scheme using ground planes. One approach to forming such an embedded plane is disclosed in U.S. Pat. No. 5,472,900 entitled, "Capacitor Fabricated on a Substrate Containing Electronic Circuitry," issued Dec. 5, 1995 and assigned to the assignee of the present invention. This patent teaches a method of forming an embedded plane on a semiconductor substrate using few additional masking steps. According to the disclosed invention, a first conductive layer is deposited on a dielectric layer. In the referenced patent, this first conductive layer forms the first plate of a capacitor although a similar process may be used to form the embedded ground plane of the present invention. A thin insulative layer is deposited on the first conductive layer followed by a second conductive layer, which in this case may be the interconnect of the present invention. Vias are then patterned extending through all insulative and conductive layers using a single masking layer in one embodiment, and a blanket dielectric is deposited and anisotropically etched to form a sidewall insulator for the vias. A metal layer is then deposited to provide interconnection between metal layers beneath the embedded ground plane and higher level metal layers. In this way, no additional masking steps are required to form the structure. One to two additional masking steps may be required to connect the interconnect 41 and the embedded ground plane current return path 46 to power and ground respectively.

In operation, using a power bus as an example, the interconnect 41 may be about 120 μm wide and have a thickness of about 1.7 μm. The insulating layer 47 shown in FIG. 4B is about 120 μm wide and about 1 μm thick. Calculations show that the loop formed by the interconnect 41 and the dedicated current return path 46 in this example with the above dimensions provides an inductance of about 0.19 nH/cm, a capacitance of about 44 pF/cm, and a resistance of about 4 ohm/cm (assuming that the interconnect and the dedicated current return are formed of aluminum and the dielectric layer is formed of silicon dioxide). In this situation then, the RC time constant is about 0.18 ns and the inductive L/R time constant is 0.05 ns. The circuit is thus very close to critical damping while being slightly RC dominated such that it will not oscillate.

Thus, the present invention provides a method and apparatus for controlling the inductance of an integrated circuit device interconnect. Whereas many alterations and modifications of the invention may occur to one of ordinary skill in the art after having read the foregoing description, it is to be understood that the particular embodiments shown and described by way of illustration are in no way intended to be considered limiting. Therefore, references to details of various embodiments are not intended to limit the scope of the claims which in themselves recite only those features regarded as essential to the invention.

We claim:

1. An integrated circuit device comprising:
   a first insulating layer disposed on a semiconductor substrate;
   an interconnect disposed on the first insulating layer, the interconnect extending along a first patterned path; and
   a dedicated current return metal line having one end configured to be coupled to ground, the dedicated current return being formed on the first insulating layer, the dedicated current return metal line extending along a second patterned path parallel to the first patterned path, the dedicated current return metal line to provide a path to ground that is predetermined only for signals transmitted over the interconnect.

2. The integrated circuit device as set forth in claim 1 wherein the interconnect is a power bus.

3. The integrated circuit device as set forth in claim 1 wherein the interconnect is a clock trunk.

4. The integrated circuit device as set forth in claim 1 wherein the interconnect is a signal bus including a plurality of signal paths.

5. The integrated circuit device as set forth in claim 1 wherein the interconnect is formed in a first metal layer disposed on the first insulating layer, the first metal layer having first metal lines extending in a first direction and wherein the dedicated current return is formed in a second metal layer having second metal lines parallel to the first metal layer and being separated from the first metal layer by a second insulating layer disposed on the first metal layer.

6. The integrated circuit device as set forth in claim 1 wherein the interconnect and the dedicated current return are formed in a same metal layer of the integrated circuit device.

7. The integrated circuit device as set forth in claim 1 wherein the interconnect is formed in a first metal layer of the integrated circuit device and the dedicated current return is embedded in a selective area in the integrated circuit device.

8. The integrated circuit device as set forth in claim 7 wherein the selective area is in an insulating layer adjacent to the first metal layer.

9. A semiconductor device formed on a substrate comprising:
   a first insulating layer formed on the substrate;
   an interconnect formed in a first metal layer, the interconnect being configured to receive and transmit a signal, the interconnect extending along a first patterned path; and
   a dedicated current return metal line formed in the first metal layer, the dedicated current return metal line extending along a second patterned path parallel to the first patterned path, the dedicated current return metal line being configured to be coupled to ground to provide a path to ground that is predetermined only for the signal transmitted over the interconnect.

10. The semiconductor device as set forth in claim 9 wherein the interconnect is one of a signal bus including a plurality of signal paths, a clock trunk or a power bus.

11. A semiconductor device including first and second metal layers separated by an insulating layer, the semiconductor device comprising:
    an interconnect formed in one of the first or second metal layers, the interconnect being configured to receive and transmit a signal, the interconnect extending along a first patterned path; and
    a dedicated current return patterned path formed in the other of the first or second metal layers, the dedicated current return patterned path being parallel to the interconnect, the dedicated current return patterned path being configured to be coupled to ground to provide a patterned path to ground that is predetermined only for the signal.

12. The semiconductor device as set forth in claim 11 wherein the interconnect is one of a signal bus including a plurality of signal paths, a clock trunk or a power bus.

13. An integrated circuit device formed on a substrate, the integrated circuit device comprising:
    a first insulating layer formed on the substrate;
    a first metal layer formed on the first insulating layer, the first metal layer including an interconnect extending along a first patterned path, the interconnect being configured to receive a signal;
    a second insulating layer formed on the first metal layer; and
    a dedicated current return metal line embedded in one of the first or second insulating layers, the dedicated current return metal line extending along a second patterned path parallel to the first patterned path, the dedicated current return metal line being configured to be coupled to ground to provide a path to ground that is predetermined only for the signal.

14. The integrated circuit device as set forth in claim 11 wherein the interconnect is one of a signal bus including a plurality of signal paths, a clock trunk or a power bus.

* * * * *